(12) United States Patent
Huang et al.

(10) Patent No.: US 11,401,156 B2
(45) Date of Patent: Aug. 2, 2022

(54) MICRO-ELECTRO-MECHANICAL SYSTEM SILICON ON INSULATOR PRESSURE SENSOR AND METHOD FOR PREPARING SAME

(71) Applicant: SOUTHEAST UNIVERSITY, Jiangsu (CN)

(72) Inventors: Xiaodong Huang, Jiangsu (CN); Zhikang Lan, Jiangsu (CN); Pengfei Zhang, Jiangsu (CN)

(73) Assignee: SOUTHEAST UNIVERSITY, Jiangsu (CN)

( * ) Notice: Subject to any disclaimer, the term of this patent is extended or adjusted under 35 U.S.C. 154(b) by 0 days.

(21) Appl. No.: 17/506,146

(22) Filed: Oct. 20, 2021

(65) Prior Publication Data

US 2022/0033247 A1 Feb. 3, 2022

(30) Foreign Application Priority Data

Jan. 12, 2021 (CN) .......................... 202110036056.2

(51) Int. Cl.
   *B81B 3/00* (2006.01)
   *B81C 1/00* (2006.01)
   *H01L 27/12* (2006.01)

(52) U.S. Cl.
   CPC ........ *B81B 3/0018* (2013.01); *B81C 1/00166* (2013.01); *H01L 27/1203* (2013.01);
   (Continued)

(58) Field of Classification Search
   CPC .......................... B81B 3/0018; G01L 19/0092
   See application file for complete search history.

(56) References Cited

U.S. PATENT DOCUMENTS

2016/0327441 A1* 11/2016 Iwase .................... G01L 1/2206

FOREIGN PATENT DOCUMENTS

| CN | 103364118 A | 10/2013 |
| CN | 104165715 A | 11/2014 |

(Continued)

*Primary Examiner* — Moazzam Hossain
(74) *Attorney, Agent, or Firm* — Muncy, Geissler, Olds & Lowe, P.C.

(57) ABSTRACT

The present invention discloses a micro-electro-mechanical system silicon on insulator (MEMS SOI) pressure sensor and a method for preparing the same. The pressure sensor includes a bulk silicon layer, a buried oxide layer, a substrate, a varistor, a passivation layer, and an electrode layer. The varistor is obtained by means of photolithography and ion implantation on a device layer of an SOI wafer. The passivation layer is $SiO_2$ formed by means of annealing treatment on the SOI wafer. An annealing atmosphere is one of pure $O_2$, a gas mixture of $O_2/H_2O$, a gas mixture of $O_2/NO$, a gas mixture of $O_2/HCl$, and a gas mixture of $O_2/CHF_3$. By means of the annealing treatment, the damage to a surface of the buried oxide layer as a result of overetching during formation of the varistor by means of photolithography is eliminated and the unstability of the sensor caused by body and interface defects of the passivation layer and trapped charges thereof is resolved. A trench is formed at the buried oxide layer and the bulk silicon layer directly below the varistor, which helps overcome defects as a result of doped impurities entering the buried oxide layer below the varistor, and helps improve the sensitivity of the sensor.

5 Claims, 3 Drawing Sheets

(52) U.S. Cl.
CPC .......... *B81B 2201/0264* (2013.01); *B81C 2201/0156* (2013.01)

(56) References Cited

FOREIGN PATENT DOCUMENTS

| | | |
|---|---|---|
| CN | 107673306 A | 2/2018 |
| CN | 111620295 A | 9/2020 |

\* cited by examiner

MICRO-ELECTRO-MECHANICAL SYSTEM SILICON ON INSULATOR PRESSURE SENSOR AND METHOD FOR PREPARING SAME

TECHNICAL FIELD

The present invention relates to a micro-electro-mechanical system silicon on insulator (MEMS SOI) pressure sensor and a method for preparing the same.

BACKGROUND

Pressure sensors are widely used in numerous fields such as industrial production, environmental monitoring, aerospace, and the like. A micro-electro-mechanical system (MEMS) pressure sensor has the characteristics of a small size, high precision, and easy integration. Therefore, the MEMS is widely favored by people. According to the working principle, the MEMS pressure sensor is mainly divided into types such as piezoresistive, piezoelectric, capacitive, and resonant. The MEMS piezoresistive pressure sensor is a device formed by means of the piezoresistive effect of single crystal silicon, and has the advantages of simple structure and preparation, low costs, and good overall performance.

In recent years, a MEMS SOI piezoresistive pressure sensor has also appeared, which is composed of a device layer, a buried oxide layer, and a bulk silicon layer. In a typical MEMS SOI piezoresistive pressure sensor, a varistor is disposed on the device layer, and dielectric isolation is achieved between the device layer and the bulk silicon layer (base) by using the buried oxide layer. Compared with the pn junction isolation method used between the varistor and the base of the conventional MEMS piezoresistive sensor, the dielectric isolation method between the varistor and the base of the MEMS SOI piezoresistive sensor can help control the leakage problem of the sensor. Therefore, the MEMS SOI piezoresistive sensor is very suitable for being used in harsh environments under a high temperature, high radiation, and the like.

It should be noted that the varistor disposed in the device layer is often etched to form islands to eliminate leakage and crosstalk between the varistors, and then the island-shaped varistors are doped to reduce the resistance value of the piezoresistor and form ohmic contact with an electrode. The above preparation process may have two negative effects on the performance of the sensor: 1) In order to ensure that the device layer other than the varistor is completely etched, it is often necessary to perform over-etching. However, the over-etching may cause damage to a surface of the exposed buried oxide layer, resulting in defects on the surface of the buried oxide layer and trapping charges; 2) During doping of the varistor, doped impurities easily pass through the varistor and enter the buried oxide layer directly below the varistor, causing defects to be introduced and charges to be trapped in the buried oxide layer directly facing the varistor. The trapped charge above may drift under different excitation or operating conditions, which may cause the sensor performance to drift. Therefore, the existing MEMS SOI piezoresistive pressure sensor is unstable. In addition, the sensitivity of the existing MEMS SOI piezoresistive pressure sensor still needs to be improved to further improve the device performance and reduce the design difficulty of the interface circuit.

SUMMARY

Purpose of invention: In view of the foregoing prior art, a MEMS SOI pressure sensor and a method for preparing the same are provided to improve the stability and sensitivity of a MEMS SOI piezoresistive pressure sensor.

Technical solutions: A MEMS SOI pressure sensor includes a bulk silicon layer, a buried oxide layer, a substrate, a varistor, a passivation layer, and an electrode layer. The bulk silicon layer is located on an upper surface of the substrate, the buried oxide layer is located on an upper surface of the bulk silicon layer, the bulk silicon layer is provided with a cavity inside, and the bulk silicon layer directly above the cavity and the buried oxide layer jointly form a pressure sensitive film. The varistor is located on an upper surface of the buried oxide layer, the passivation layer is configured to wrap an upper surface and a peripheral side of the varistor, and an electrode connection hole is provided at a center of a top of the passivation layer. The electrode layer is located on an upper surface of the passivation layer, and is connected to the varistor through the electrode connection hole. The varistor is obtained by means of photolithography and ion implantation on a device layer of an SOI wafer, the passivation layer is $SiO_2$ formed by means of annealing treatment on the SOI wafer, an annealing atmosphere is one of pure $O_2$, a gas mixture of $O_2/H_2O$, a gas mixture of $O_2/NO$, a gas mixture of $O_2/HCl$, and a gas mixture of $O_2/CHF_3$, and the damage to a surface of the buried oxide layer as a result of over-etching during formation of the varistor by means of photolithography is repaired by means of the annealing treatment. A trench is formed at the buried oxide layer and the bulk silicon layer directly below the varistor by means of trepanning.

Further, the pressure sensor includes four varistors disposed on the upper surface of the buried oxide layer. The four varistors are respectively disposed directly above midpoints of four sides of the cavity. The four varistors are connected by using a Wheatstone bridge.

Further, a thickness of the passivation layer is in a range of 100-1000 nm.

Further, spacings between an edge of the trench and an edge of the varistor in length and width directions of the varistor are in a range of 3-20 μm.

Further, a thickness of the pressure sensitive film is in a range of 2-20 μm.

Further, a material of the substrate is single crystal silicon or glass, and a thickness of the substrate is in a range of 200-2000 μm.

A method for preparing the MEMS SOT pressure sensor, the method including the following steps:

step 1: preparing an SOT wafer, where the SOT wafer is composed of a bulk silicon layer, a buried oxide layer, and a device layer;

step 2: performing photolithography and ion implantation on the device layer of the SOT wafer to form a varistor;

step 3: rinsing the SOT wafer, and then annealing the SOT wafer in an oxygen atmosphere, where the annealing atmosphere is one of pure $O_2$, a gas mixture of $O_2/H_2O$, a gas mixture of $O_2/NO$, a gas mixture of $O_2/HCl$, and a gas mixture of $O_2/CHF_3$, an annealing temperature is in a range of 850-950 degrees Celsius, damage to a surface of the buried oxide layer as a result of over-etching during formation of the varistor by means of photolithography is repaired by means of the annealing treatment, and an $SiO_2$ layer is formed on a surface of the varistor as a passivation layer;

step 4: forming an electrode connection hole at a center of a top of the passivation layer by means of photolithography;

step 5: forming, as an electrode layer, metal on a surface of the passivation layer and inside the electrode connection hole by means of magnetron sputtering and photolithography;

step 6: performing photolithography on a lower surface of the bulk silicon layer to form an open cavity;

step 7: forming a trench directly below the varistor by means of double-sided alignment and photolithography; and step 8: preparing a substrate, and attaching the substrate to a bottom of the SOI wafer by means of bonding to form a cavity, so as to complete the preparation of the MEMS SOI pressure sensor.

The beneficial effects are as follows. Compared with the prior art, the present invention has the following advantages.

1. Compared with the prior art, the sensor of the present invention can effectively repair the etching damage on the surface of the buried oxide layer by means of the annealing treatment in an oxygen atmosphere after the island-shaped varistor is formed by etching, thereby improving the stability of the sensor. In addition, annealing in an oxygen atmosphere may further form a high-density $SiO_2$ as a passivation layer on the surface of the varistor, avoiding the need to introduce additional processes to prepare the passivation layer of the varistor. Therefore, the process of preparing the sensor is simplified. In addition, $SiO_2$ or SiN formed by means of physical or chemical vapor deposition is commonly used as the passivation layer. Compared with the passivation layer used in the prior art, the $SiO_2$ formed by means of thermal oxidation in the present invention has fewer body defects as the passivation layer, higher quality, and better interface quality with the varistor. In this way, the unstability of the sensor caused by the body and interface defects of the passivation layer and the trapped charges in the prior art can be effectively suppressed, which also helps to improve the stability of the sensor.

2. Compared with the prior art, the sensor of the present invention is provided with a trench under the varistor, which helps to suppress the defects caused by doped impurities entering the buried oxide layer under the varistor in the prior art and overcome the unstability of the sensor caused by the defects. Therefore, the stability of the sensor can be further improved. Moreover, a stress concentration effect is generated in a varistor region. Therefore, the sensor of the present invention has higher sensitivity.

DETAILED DESCRIPTION

The present invention is further described in detail with reference to the accompanying drawings.

Figure 1:
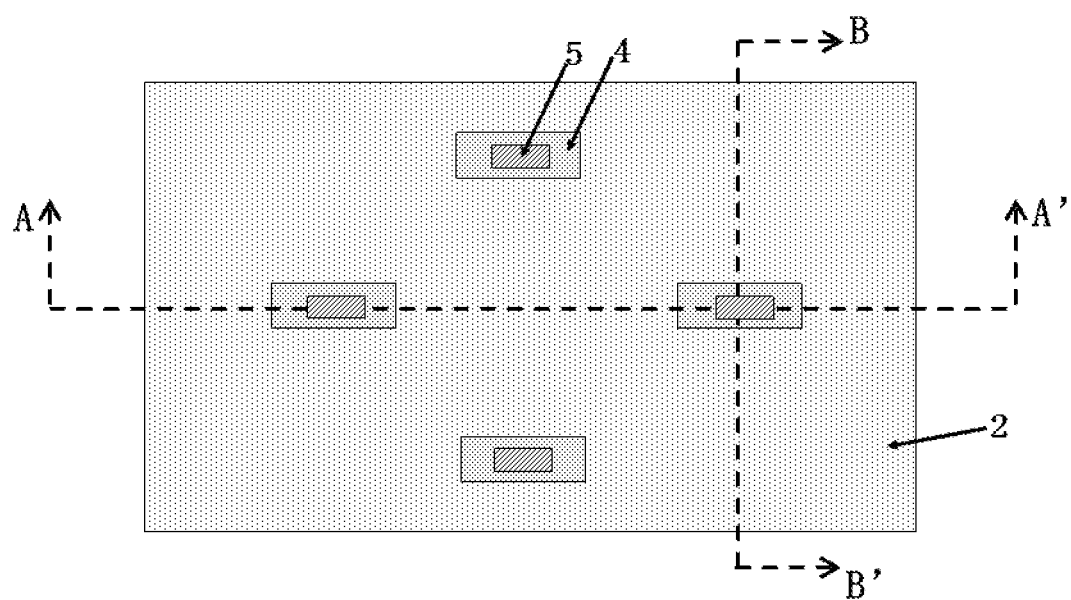
FIG. 1 is a schematic structural top view of a MEMS SOI pressure sensor according to an embodiment of the present invention.
Figure 2:
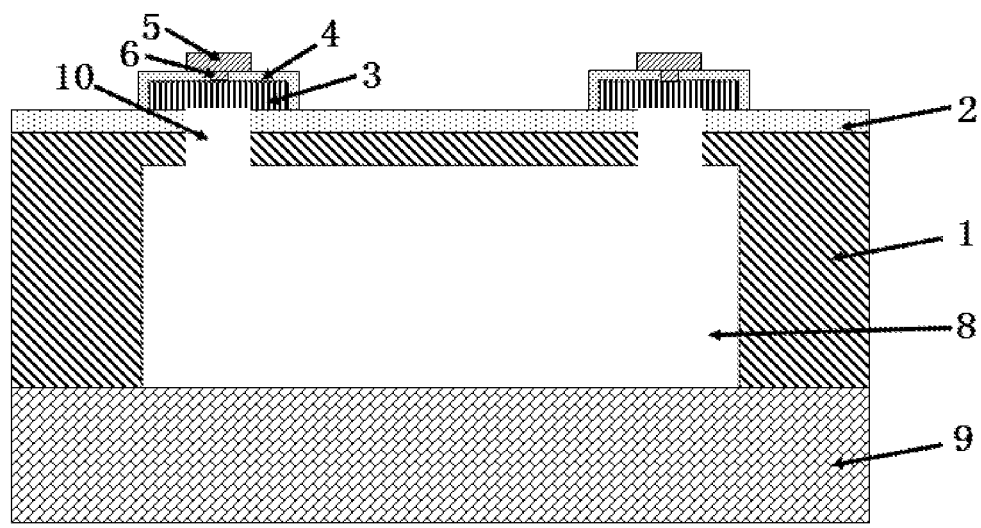
FIG. 2 is a cross-sectional view taken along an A-A' line in FIG. 1.
Figure 3:
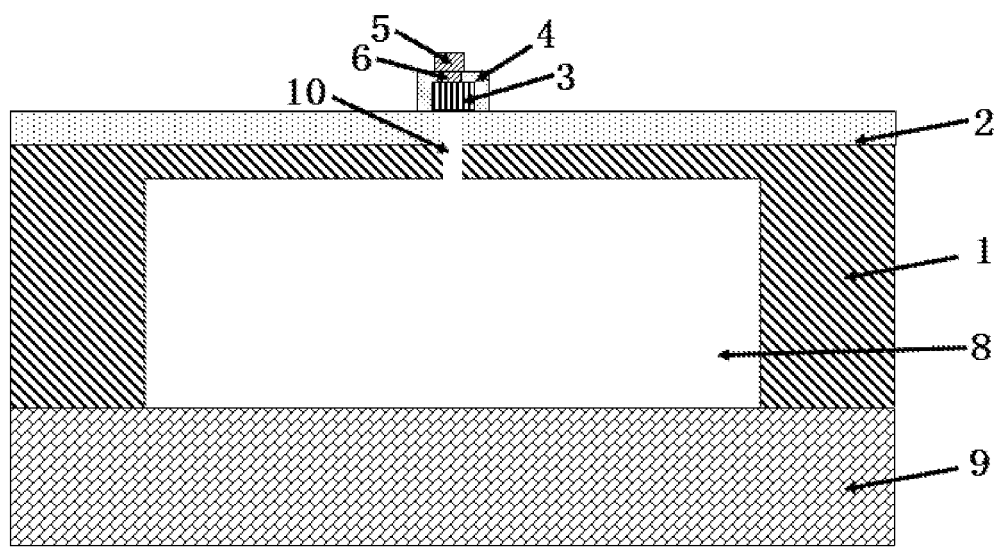
FIG. 3 is a cross-sectional view taken along a B-B' line in FIG. 1.

As shown in FIG. 1 to FIG. 3, a MEMS SOI pressure sensor includes a bulk silicon layer 1, a buried oxide layer 2, a substrate 9, a varistor 3, a passivation layer 4, and an electrode layer 5. The bulk silicon layer 1 is located on an upper surface of the substrate 9, and the buried oxide layer 2 is located on an upper surface of the bulk silicon layer 1. A cavity 8 is disposed inside the bulk silicon layer 1, and the bulk silicon layer 1 directly above the cavity 8 and the buried oxide layer 2 jointly form a pressure sensitive film.

The four varistors 3 are located on an upper surface of the buried oxide layer 2 and are respectively disposed directly above midpoints of four sides of the cavity 8. The position can generate a large stress and strain under deformed conditions, which helps improve the sensitivity of the sensor. Each varistor 3 is separately provided with a passivation layer 4 and an electrode layer 5. Specifically, the passivation layer 4 is configured to wrap an upper surface and a peripheral side of the varistor 3, and an electrode connection hole 6 is provided at a center of a top of the passivation layer 4. The electrode layer 5 is located on an upper surface of the passivation layer 4, and is connected to the varistor 3 through the electrode connection hole 6. The four varistors 3 are connected by using a Wheatstone bridge.

The varistor 3 is obtained by means of photolithography and ion implantation on a device layer of an SOI wafer. The passivation layer 4 is $SiO_2$ formed by means of annealing treatment on the SOI wafer. An annealing atmosphere is one of pure $O_2$, a gas mixture of $O_2/H_2O$, a gas mixture of $O_2/NO$, a gas mixture of $O_2/HCl$, and a gas mixture of $O_2/CHF_3$. The damage to a surface of the buried oxide layer 2 as a result of over-etching during formation of the varistor 3 by means of photolithography is repaired by means of the annealing treatment. A trench 10 is formed at the buried oxide layer 2 and the bulk silicon layer 1 directly below the varistor 3 by means of trepanning.

In the above MEMS SOI pressure sensor, a material of the substrate 9 is single crystal silicon or glass, and a thickness of the substrate is in a range of 200-2000 μm. A thickness of the pressure sensitive film is in a range of 2-20 μm. A thickness of the passivation layer 4 is in a range of 100-1000 nm. Spacings between an edge of the trench 10 and an edge of the varistor in length and width directions of the varistor 3 are in a range of 3-20 μm. This not only helps reduce the difficulty of alignment and preparation between the trench 10 and the varistor 3, but also ensures that most of the buried oxide layer directly below the varistor 3 is removed. In this way, the defects caused by the doped impurities entering the buried oxide layer under the varistor and the unstability of the sensor caused by the defects are suppressed, and it is also ensured that the varistor 3 disposed above the trench 10 generates a considerable stress concentration effect and obtains desirable mechanical strength. A material of the electrode layer 5 is metal, preferably one of Al, Ti, Au, Cr, Cu, and Pt.

The operating principle of the MEMS SOI pressure sensor of the present invention is as follows.

The pressure sensitive film deforms under the action of external pressure and causes strain on the four varistors 3 on the pressure sensitive film. Based on the piezoresistive effect, resistance values of the four varistors 3 change accordingly, and the resistance value variation is measured by using the Wheatstone bridge, thereby achieving the conversion from an environmental pressure signal to an electrical signal.

The method for preparing the MEMS SOI pressure sensor includes the following steps.

Step 1: Prepare an N-type (100) SOI wafer, where the SOI wafer is composed of a bulk silicon layer 1, a buried oxide layer 2, and a device layer.

Step 2: Perform photolithography and ion implantation on the device layer of the SOI wafer to form a varistor 3.

Step 3: Rinse the SOI wafer, and then anneal the SOI wafer in an oxygen atmosphere, where the annealing atmosphere is one of pure $O_2$, a gas mixture of $O_2/H_2O$, a gas mixture of $O_2/NO$, a gas mixture of $O_2/HCl$, and a gas mixture of $O_2/CHF_3$, an annealing temperature is in a range of 850-950 degrees Celsius. The damage to a surface of the buried oxide layer 2 as a result of over-etching during formation of the varistor 3 by means of photolithography is repaired by means of the annealing treatment, and an SiO$_2$ layer is formed on a surface of the varistor 3 as a passivation layer 4, the annealing temperature is set in a range of 850-950 degrees Celsius, so as to not only ensure high-quality SiO$_2$, but also to avoid the problem of SOI wafer cracking caused by high-temperature annealing.

Step 4: Form an electrode connection hole 6 at a center of a top of the passivation layer 4 by means of photolithography.

Step 5: Form, as an electrode layer 5, metal on a surface of the passivation layer 4 and inside the electrode connection hole 6 by means of magnetron sputtering and photolithography.

Step 6: Perform photolithography on a lower surface of the bulk silicon layer 1 to form an open cavity.

Step 7: Form a trench 10 directly below the varistor 3 by means of double-sided alignment and photolithography.

Step 8: Prepare a substrate 9, and attach the substrate 9 to a bottom of the SOI wafer by means of bonding to form a cavity 8, so as to complete the preparation of the MEMS SOI pressure sensor.

The foregoing descriptions are exemplary implementations of the present invention. It is noted that a person of ordinary skill in the art may make some improvements and modifications without departing from the principle of the present invention, and the improvements and modifications shall fall within the protection scope of the present invention.

What is claimed is:

1. A micro-electro-mechanical system silicon on insulator (MEMS SOI) pressure sensor, comprising a bulk silicon layer, a buried oxide layer, a substrate, a varistor, a passivation layer, and an electrode layer, wherein the bulk silicon layer is located on an upper surface of the substrate, the buried oxide layer is located on an upper surface of the bulk silicon layer, the bulk silicon layer is provided with a cavity inside, and the bulk silicon layer directly above the cavity and the buried oxide layer jointly form a pressure sensitive film; the varistor is located on an upper surface of the buried oxide layer, the passivation layer is configured to wrap an upper surface and a peripheral side of the varistor, and an electrode connection hole is provided at a center of a top of the passivation layer; the electrode layer is located on an upper surface of the passivation layer, and is connected to the varistor through the electrode connection hole, wherein the varistor is obtained by means of photolithography and ion implantation on a device layer of an SOI wafer, the passivation layer is SiO$_2$ formed by means of annealing treatment on the SOI wafer, an annealing atmosphere is one of pure O$_2$, a gas mixture of O$_2$/H$_2$O, a gas mixture of O$_2$/NO, a gas mixture of O$_2$/HCl, and a gas mixture of O$_2$/CHF$_3$, and damage to a surface of the buried oxide layer as a result of over-etching during formation of the varistor by means of photolithography is repaired by means of the annealing treatment; and a trench is formed at the buried oxide layer and the bulk silicon layer directly below the varistor by means of trepanning, wherein spacings between an edge of the trench and an edge of the varistor in length and width directions of the varistor are in a range of 3-20 µm.

2. The MEMS SOI pressure sensor according to claim 1, comprising four varistors, disposed on the upper surface of the buried oxide layer, wherein the four varistors are respectively disposed directly above midpoints of four sides of the cavity, and the four varistors are connected by using a Wheatstone bridge.

3. The MEMS SOI pressure sensor according to claim 1, wherein a thickness of the passivation layer is in a range of 100-1000 nm.

4. The MEMS SOI pressure sensor according to claim 1, wherein a thickness of the pressure sensitive film is in a range of 2-20 µm.

5. The MEMS SOI pressure sensor according to claim 1, wherein a material of the substrate is single crystal silicon or glass, and a thickness of the substrate is in a range of 200-2000 µm.

\* \* \* \* \*